(12) United States Patent
Lou

(10) Patent No.: US 6,271,099 B1
(45) Date of Patent: Aug. 7, 2001

(54) METHOD FOR FORMING A CAPACITOR OF A DRAM CELL

(75) Inventor: Chine-Gie Lou, Hsinchu Hsien (TW)

(73) Assignee: Worldwide Semiconductor Manufacturing Corp., Taiwan ( * ) Notice: Subject to any disclaimer, the term of this patent is extended or adjusted under 35 U.S.C. 154(b) by 0 days.

(21) Appl. No.: 09/406,728

(22) Filed: Sep. 28, 1999

(30) Foreign Application Priority Data

Aug. 24, 1999 (TW) .................................................. 88114484

(51) Int. Cl.$^7$ .................................................. H01L 21/20
(52) U.S. Cl. .................. 438/396; 438/253; 438/396; 438/397; 438/399; 438/639; 438/648; 438/649; 257/308; 257/309; 257/310
(58) Field of Search .................. 438/396, 397, 438/399, 639, 648, 649, 253

(56) References Cited

U.S. PATENT DOCUMENTS

| | | | |
|---|---|---|---|
| 5,622,883 | * | 4/1997 | Kim ...................................... 438/396 |
| 5,780,339 | * | 7/1998 | Liu et al. .............................. 438/253 |
| 6,015,733 | * | 1/2000 | Lee et al. ............................. 438/253 |
| 6,133,089 | * | 10/2000 | Huang et al. ........................ 438/254 |
| 6,136,661 | * | 10/2000 | Yen et al. ............................. 438/396 |
| 6,159,820 | * | 12/2000 | Park ...................................... 438/396 |
| 6,160,013 | * | 8/2000 | Tu ........................................ 438/253 |
| 6,174,782 | * | 1/2001 | Lee ...................................... 438/398 |
| 6,221,713 | * | 4/2001 | Huang .................................. 438/241 |

* cited by examiner

Primary Examiner—Matthew Smith
Assistant Examiner—B. V. Keshavan

(57) ABSTRACT

A method for forming a DRAM cell with a crown full metal capacitor electrode with integrated selective tungsten contact hole. When the MOSFET devices are defined, a metal landing pad with Ti/TiN/W/TiN is first deposited and etched. After an insulating layer is deposited and node contact is formed, a CVD TiN layer is deposited and etched to form TiN spacers on the node contact sidewalls. Next, selective tungsten is formed in the node contact and use reactive ion etching to etch back. Thereafter, another insulating layer is deposited and the crown pattern opening is formed. Then, a TiN/W metal layer is deposited to serve as the bottom electrode of the stacked capacitor. After a photoresist layer is formed, then a chemical mechanical polishing method is used to remove portions of the photoresist layer and the TiN/W metal layer by using insulating layer as an polishing stop. The remaining photoresist and insulating layer are removed. Subsequently, a high dielectric film and another metal layer is deposited to complete the present invention. The process of the invention to fill the high aspect ratio node contact with selective tungsten and the stacked capacitor with metal electrode structure will provide a high reliability DRAM cell.

20 Claims, 4 Drawing Sheets

METHOD FOR FORMING A CAPACITOR OF A DRAM CELL

FIELD OF THE INVENTION

The present invention relates to the fabrication of integrated circuit devices and, more particularly to a method of forming a capacitor structure with low interfacial reaction and increased capacitance of a dynamic random access memory (DRAM) cell.

BACKGROUND OF THE INVENTION

For ultra large scale integration (ULSI) semiconductor technologies nowadays, the dramatically increased of the integrated circuit density has downsizing the individual devices. Dynamic random access memory (DRAM) circuit is one of the integrated circuit types to experience the demand of increased density, which is used extensively in the electronics industry for information storage. Normally, one can evaluate the development of a semiconductor-manufacturing factory by the minimum conductive line, or the storage capacity of DRAM devices it can produce.

The memory cells of DRAM are comprised of two main components: a field-effect transistor (MOSFET) and a capacitor. A bit line and a word line is connected to source/drain area and gate area of MOSFET cell respectively. The other source/drain area of MOSFET is electrically connected to the capacitor. During operations, the digital signal of bit line is stored to the capacitor via the controlled voltage of word line. A single DRAM storage cell stores a bit of data on the capacitor as electrical charge. As component density in memory chips has increased, the shrinkage of cell capacitor size has resulted in a number of problems. Firstly, α-particle component of normal background radiation will generate hole-electron pairs in the n+silicon substrate plate of a cell capacitor. This phenomena will cause the charge within the affected cell capacitor to rapidly dissipate, resulting in a "soft" error. Secondly, the cell refresh time must be shortened due to the cell capacitance is reduced, thus more refresh interruptions are required.

Owing to all the problems described above, several stacked structures of capacitor are introduced to increase capacitance, such as fin shaped or crown shaped capacitor structure. Alternatively, another scheme involves the use of high dielectric constant materials such as $Ta_2O_5$ or $BaTiO_3$ to further increase the capacitance.

Although the efforts to provide adequate cell capacitance focus on creating complex three-dimensional capacitors and improving the dielectric materials, some problems are still exist in fabricating the DRAM cells. One of the problems is that the conventional lower capacitor node contact comprises semiconductor material such as doped polysilicon layer, which the interfacial reaction is inevitable. Besides, the capacitor node contact filling becomes increasingly difficult as a result of reduced device dimensions. For node contact with high aspect ratio (more than ten), it is not easy to use a Physical Vapor Deposition (PVD) method to fill barrier metal or use a Chemical Vapor Deposition (CVD) method to fill tungsten (W).

Although a considerable work has been done to improve the reliability of DRAM cells, there is still a strong need in the semiconductor industry to further improve the reliability of DRAM cells and to increase the capacitance of the stacked capacitors for DRAM cells. This is especially true when the semiconductor fabrication proceed to next decade.

SUMMARY OF THE INVENTION

The present invention is directed to the fabrication of a DRAM cell. Accordingly, it is a principal object of the present invention to provide a method for fabricating a capacitor with void/seam free deposition of a high aspect ratio node contact.

It is another object of the present invention to provide a method for making a capacitor of metal/insulator/metal (MIM) structure with a high dielectric constant layer.

It is still another object of the present invention to provide a method for making a capacitor with a crown shaped to increase the capacitance.

The above objectives of this invention are achieved by providing a method for fabricating a DRAM cell with a crown shaped MIM structure capacitor. The method begins by forming a field-effect transistor (MOSFET) gate electrode and word line on a substrate. A multilayer gate electrode and word line are composed of a polycide layer and overlaying a cap layer. After the gate electrode and word line are defined, lightly doped source/drain area, sidewall spacers, and heavily doped source/drain area is formed sequentially.

Subsequently, a titanium (Ti)/titanium nitride (TiN) layer serves as a barrier layer, is deposited over the substrate. Next, a tungsten (W) layer and a TiN ARC (anti-reflection coating) layer is formed on the Ti/TiN layer. Conventional photolithographic and reactive ion etching techniques are used to define a metal landing pad.

Next, a first insulating layer is deposited and then a node contact is formed align the metal landing pad by using the tungsten layer of the metal landing pad as an etch stop. After the node contact is formed, a CVD titanium nitride is deposited within the node contact and over the first insulating layer. Then, a reactive ion etching method is used to form titanium nitride spacer in the node contact, the underlayer tungsten serves as an etch stop and is exposed. Forming selective tungsten in the node contact by using exposed tungsten as a seeding layer. The extra tungsten is then etched back by using a reactive ion etching method.

Thereafter, a second insulating layer is formed and planarized over the substrate. Conventional photolithographic and anisotropic plasma etching techniques are used to form an opening in the second insulating layer aligned with the node contact. Then, a metal layer, which serves as the bottom electrode of a stacked capacitor, is deposited by using a CVD method. The metal layer is composed of a titanium nitride and a tungsten layer. Afterwards, a photoresist layer is formed on the metal layer and then a chemical mechanical polishing method is used to remove portions of the photoresist layer and the metal layer by using the second insulating layer as an polishing stop.

A crown shaped bottom electrode is defined after the remaining photoresist and the second insulating layer is removed. Next, a high dielectric constant layer such as $Ta_2O_5$ or $BaTiO_3$ is deposited to act as capacitor dielectric layer. Finally, a titanium nitride layer is formed on the capacitor dielectric layer to complete the crown shaped capacitor.

A crown shaped capacitor with metal/insulator/metal structure, a high reliability of capacitor is achieved. Besides, with high aspect ratio node contact, it is easy for the present invention to fill with selective tungsten without void/seam.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The conventional DRAM cells with the capacitor node contact made of doped polysilicon will cause interfacial reaction, and node contact with aspect ratio higher than 10 has the difficulties of filling the barrier metal and tungsten without void/seam. The present invention discloses a method to improve the reliability of a DRAM cell with a capacitor of metal/insulator/metal (MIM) structure that can easily fill the high aspect ratio node contact with tungsten without void. Now this method is described in detail.

Figure 1:
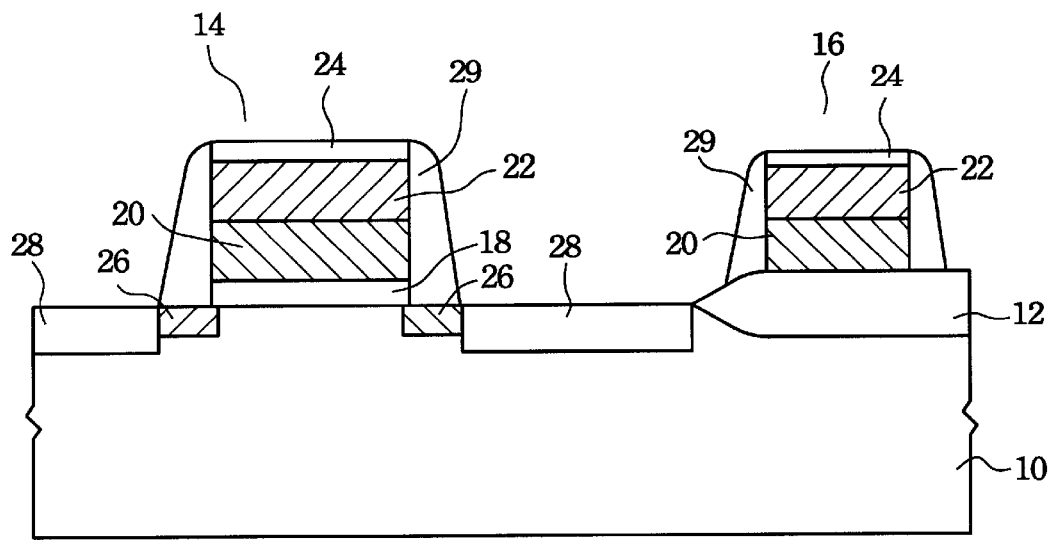
FIG. 1 is a cross-sectional view of a DRAM cell forming MOSFET device on a substrate.

Referring to FIG. 1, a schematic cross-sectional view of a portion of a semiconductor substrate 10 is shown having a partially completed DRAM cell formed on the substrate surface. The preferred substrate 10 is composed of a lightly doped P-type single crystal silicon having a <100>crystallographic orientation. A relatively thick field oxide (FOX) 12 is formed surrounding and electrically isolating the individual device regions in which the memory cells are built. The FOX 12 is most commonly formed by the local oxidation of silicon (LOCOS) method. Generally the field oxide 12 is grown to a thickness of between about 3000 to 6000 Angstroms.

Referring still to FIG. 1, conventional photolitholographic and plasma etching techniques are used to form MOSFET gate electrode 14 in the device area and word line 16 over the FOX 12. These devices are formed by first thermally oxidizing the device areas to form a thin oxide layer 18. In one embodiment, the thermal oxidation temperature is between about 800 to 900° C., the thickness of this oxide layer 18 is between about 20 to 100 Angstroms. A multilayer gate electrode 14 and word line 16 are composed of a polycide layer and a cap oxide layer. The polycide layer is composed of a polysilicon layer 20 and overlaying a refractory metal silicide layer 22. The cap oxide layer 24 is composed of a silicon oxide layer and a silicon nitride layer. The polysilicon layer 20 is deposited by using, for example, a low pressure chemical vapor deposition (LPCVD) method to a thickness between about 500 to 2000 Angstroms and doped with an N-type conductive dopant such as phosphorus ions. Subsequently, the refractory metal silicide layer 22 such as tungsten suicide ($WSi_2$), is formed on the polysilicon layer 20 to further increase the electrical conductivity. Afterwards, the cap oxide 24 is provided over the gate electrode 14 and the word line 16 to electrically insulate them from the bit line or node contact that are formed later.

After the gate electrode 14 and the word line 16 are defined, lightly doped source/drain areas 26 (N−) are formed next adjacent to the gate electrode 14. The gate electrode 14 serves as an implant mask to self-align the source/drain to the electrode. Then, sidewall spacers 29 are formed on the sidewalls of the gate electrode 14 and the word line 16. The sidewall spacers 29 are typically formed by using a CVD method to deposit silicon oxide, and then anisotropically etching back to form the sidewall spacers 29. An N+source/drain ion implantation is then used to complete the source/drain area 28 as depicted in FIG. 1.

Figure 2:
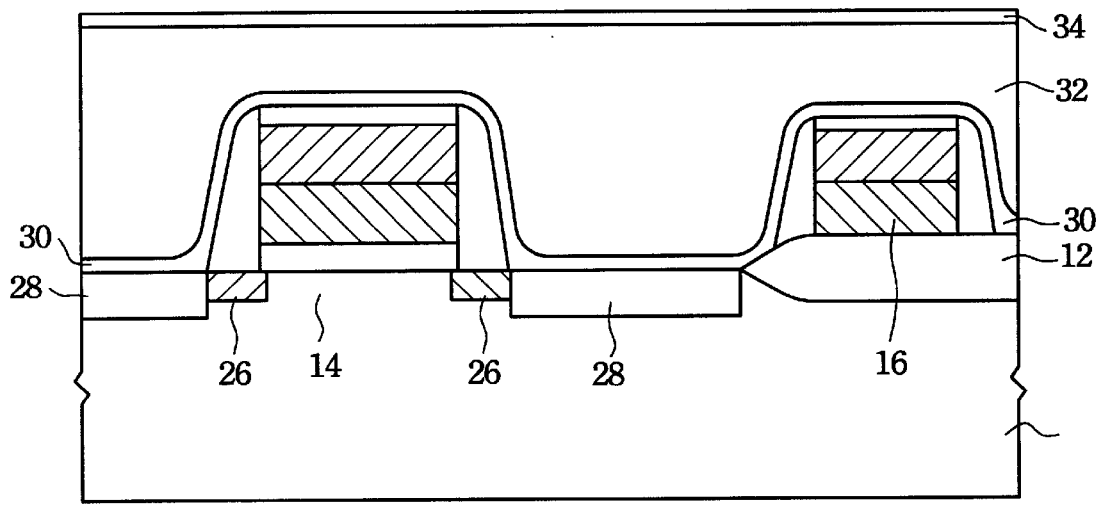
FIG. 2 is a cross-sectional view of a DRAM cell following the formation of metal layers.

Referring to FIG. 2, the cross-sectional view of this figure shows the deposition of metal layers after the gate electrode 14 and word line 16 are defined. Following the formation of the MOSFET devices, a layer of titanium (Ti)/titanium nitride (TiN) layer 30, which serves as a barrier layer, is deposited over the substrate 10. In this invention, since we are making a metal landing pad with tungsten (W), the Ti/TiN layer 30 also serves as a glue layer. In one embodiment, the thickness of the Ti/TiN layer 30 is between about 200 to 1000 angstroms and can be formed by reactive sputtering deposition or magnetic DC sputtering techniques.

Next, a layer of tungsten (W) 32 is deposited over the Ti/TiN glue layer 30 by CVD method using tungsten hexafluoride ($WF_6$) as the reactant gas. In this invention, the thickness of tungsten layer 32 is between about 2000 to 6000 angstroms. Subsequently, a titanium nitride (TiN) layer 34 is formed over the tungsten layer 32 by using reactive sputtering deposition to perform the function of an ARC (anti-reflective coating) layer. In one embodiment, the thickness of the TiN layer 34 is between about 200 to 500 angstroms.

Figure 3:
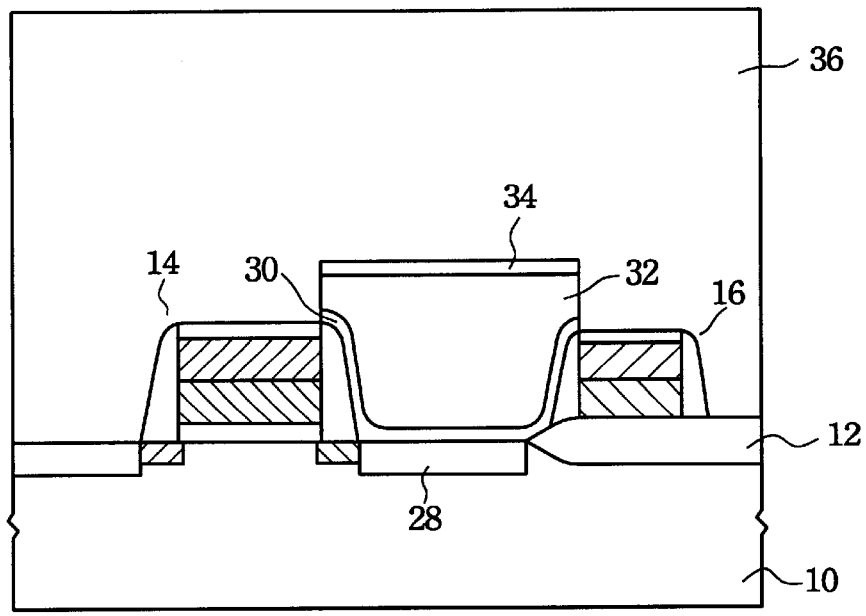
FIG. 3 is a cross-sectional view of a DRAM cell following the formation of the metal landing pad and deposition of a dielectric layer.

Referring now to FIG. 3, this figure shows a cross-sectional view of a DRAM cell following the formation of the metal landing pad and deposition of a dielectric layer. In the following steps, conventional photolithographic and anisotropic plasma etching techniques are used to define the metal landing pad of the present invention. In this invention, a reactive ion etching (RIE) method is used to achieve the acceptable selectivity. Then, a first insulating layer 36 is deposited on the substrate 10. The first insulating layer 36 is preferably a multilayer composed of an undoped silicon oxide, a boron- and phosphorus-doped borophosphosilicate glass (BPSG) and a silicon nitride. The BPSG can be deposited, for example, by a CVD method using a reactant gas such as TEOS to which are added dopant gases such as phosphine ($PH_3$) and diborane ($B_2H_6$) to the TEOS gas flow during deposition. The thickness of first insulating layer 36 is typically between about 2000 to 8000 angstroms.

Figure 4:
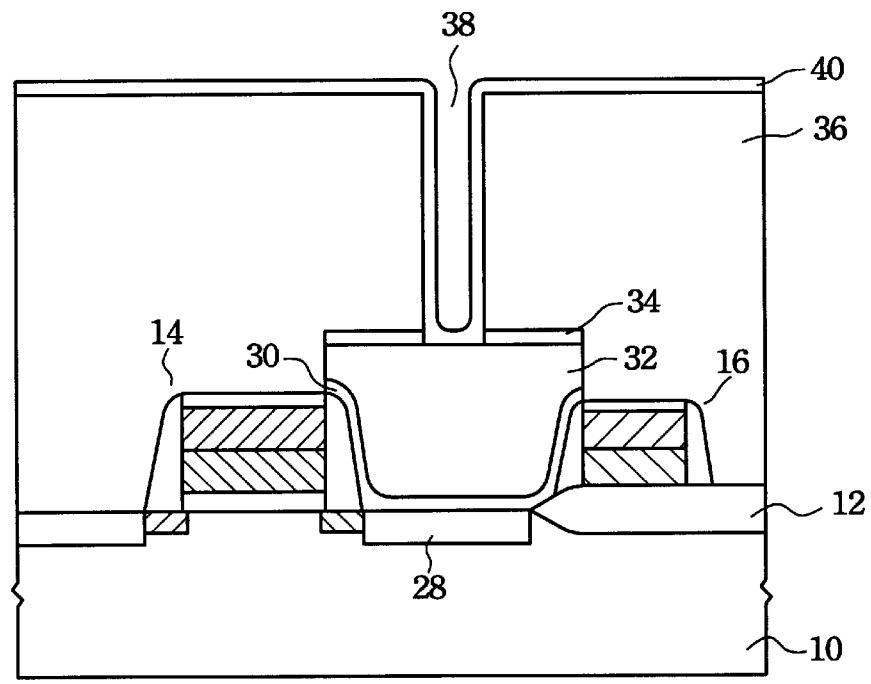
FIG. 4 is a cross-sectional view of a DRAM cell following the formation of a node contact and deposition of a titanium nitride layer.

Referring to FIG. 4, a cross-sectional view of this figure shows the formation of a node contact and deposition of titanium nitride layer. Conventional photolithographic and anisotropic plasma etching techniques are used to form the node contact 38 by using tungsten layer 32 as an etch stop. The anisotropic plasma etching is carried out in a high-density plasma etcher. Next, a layer of titanium nitride 40 is deposited by a chemical vapor deposition (CVD) method over the first insulating layer 36 and within the node contact 38. This titanium nitride layer 40 serves as a barrier layer. Because CVD method is used rather than a physical vapor deposition (PVD) method such as sputtering, a thinner titanium nitride layer with excellent step coverage can be formed. The thickness of TiN layer 40 is between about 100 to 500 angstroms.

Conventional PVD titanium nitride forms a column structure, then the subsequent tungsten deposition to form the tungsten node contact could diffuse through the titanium nitride grain boundaries and attack the underlayer. However, the CVD titanium nitride layer 40 is a microcrystalline structure. It has not only the advantage of excellent step coverage, but also not easy for $WF_6$ to diffuse through the CVD titanium nitride layer 40.

Figure 5:
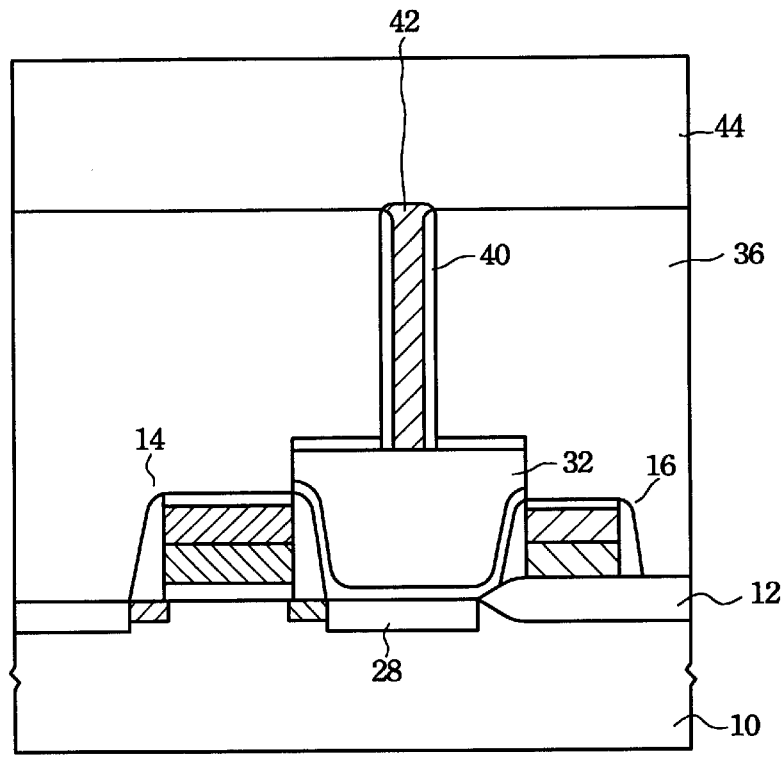
FIG. 5 is a cross-sectional view of a DRAM cell following the formation of a selective tungsten and deposition of a dielectric layer.

Referring now to FIG. 5, this figure shows mainly the following steps of node contact filling. The deposited CVD titanium nitride layer 40 is etched by using a reactive ion etching method again. Due to the characteristics of RIE etching, a titanium nitride spacer 40 is formed in the node contact 38 and the underlayer tungsten 32 of the metal landing pad serves as an etch stop and is exposed. Next, a selective tungsten method is used to deposit the selective tungsten plug 42 within the node contact 38 using the exposed tungsten 32 as a seeding layer. After the formation of titanium nitride spacer 40 and selective tungsten plug 42, the extra tungsten layer is etched back by using a reactive ion etching method or a chemical mechanical polishing (CMP) method. Subsequently, a second insulating layer 44 composed of BPSG or silicon dioxide is deposited by a CVD method over the substrate 10. In this invention, the thickness of the second insulating layer 44 is between about 3000 to 10000 Angstroms.

Figure 6:
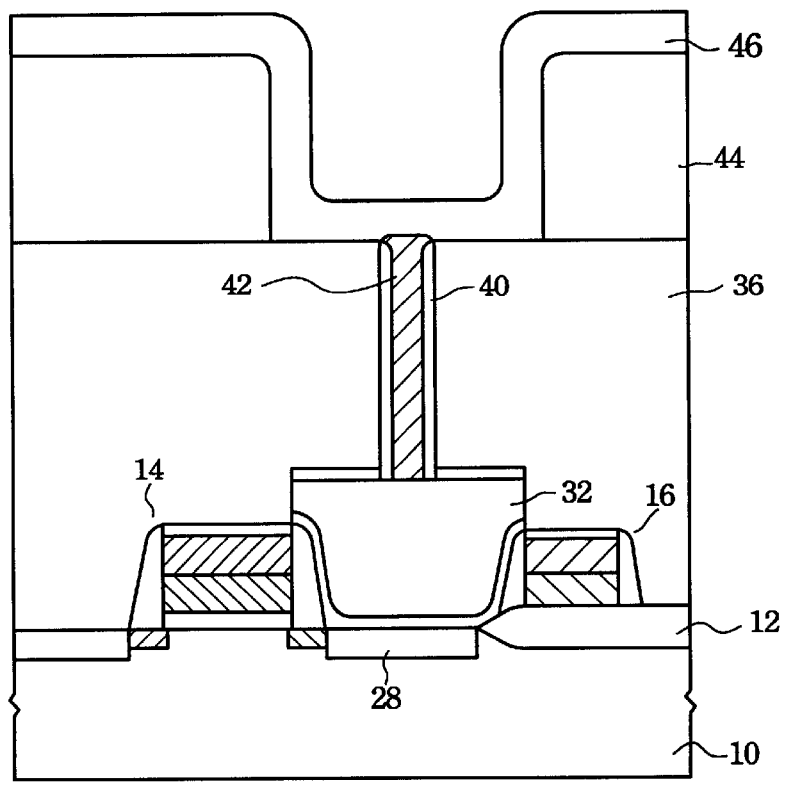
FIG. 6 is a cross-sectional view of a DRAM cell following the formation of etching the dielectric layer to form a crown pattern and deposition of a bottom plate material.

Referring to FIG. 6, the figure shows a cross-sectional view of a DRAM cell following the etching of the second insulating layer 44 to form a crown pattern. Conventional photolithographic and anisotropic plasma etching techniques are used to form an opening in the second insulating layer 44 aligned with the node contact 38. Next, a metal layer 46 is deposited over the first insulating layer 36, the second insulating layer 44, and the selective tungsten plug 42. The metal layer 46 is preferably a multilayer composed of a titanium nitride (TiN) and a tungsten (W). A CVD method is used to form the metal layer 46. In this invention, the thickness of metal layer 46 is between about 500 to 2000 Angstroms.

Figure 7:
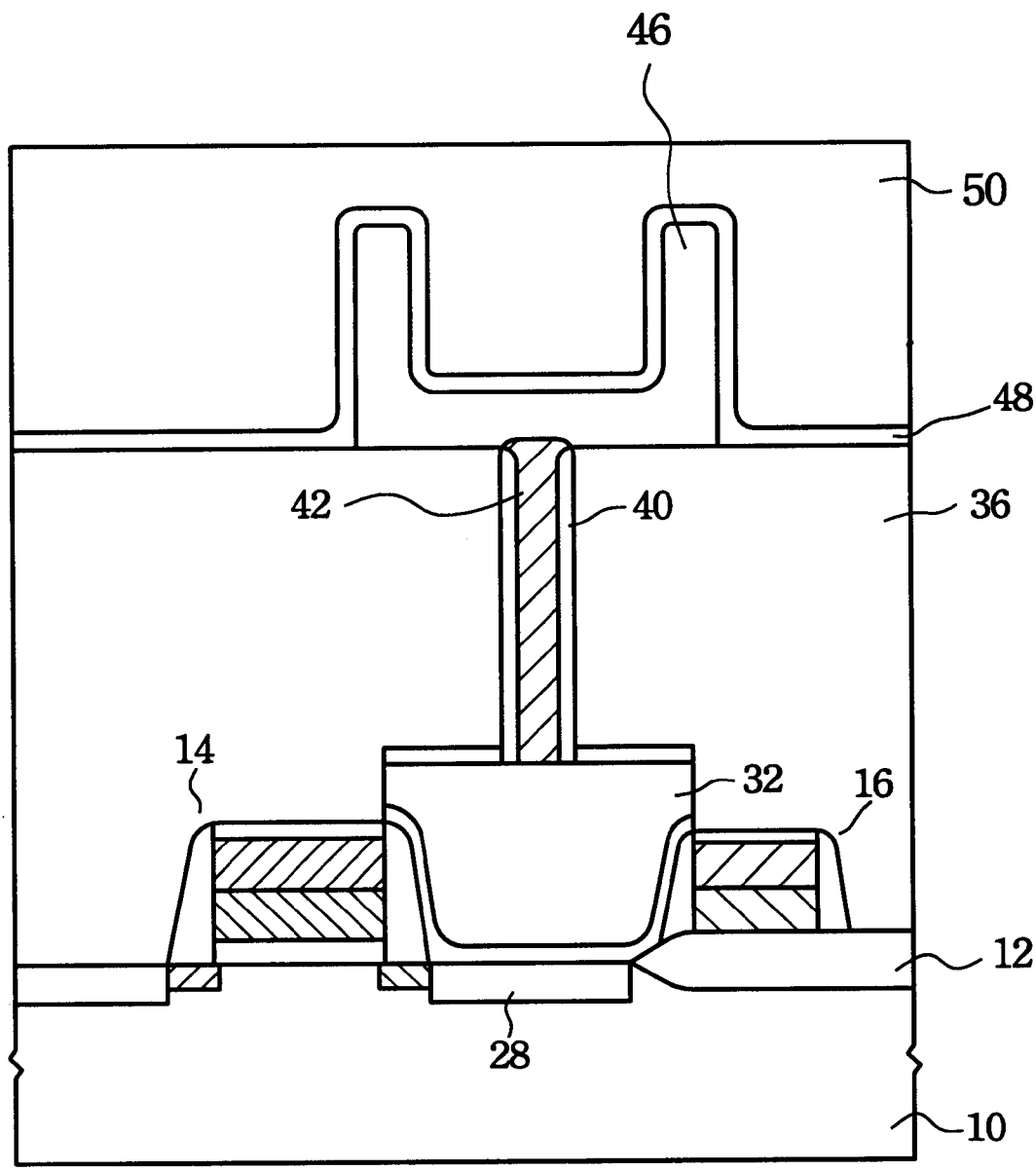
FIG. 7 is a cross-sectional view of a DRAM cell following the formation of a high dielectric constant layer and a titanium nitride layer.

Now as shown in FIG. 7, the crown shaped capacitor of a DRAM cell is completed. After the W/TiN metal layer 46 of the stacked capacitor is deposited, a photoresist is formed over this W/TiN metal layer 46 (not shown in the figure). Next, using a chemical mechanical polishing method to remove portions of the photoresist and the metal layer 46 by using the second insulating layer 44 as an polishing stop layer. A crown shaped metal layer 46 is then defined and serves as the bottom electrode of the stacked capacitor.

Thereafter, a organic or inorganic solvent is used to wet strip the remaining photoresist and a conventional wet etching is used to remove the remaining second insulating layer 44. After the removal of the photoresist and the second insulating layer 44, a thin capacitor dielectric layer 48 is formed on the crown shaped electrode 46. The capacitor dielectric layer 48 is preferably between about 40 to 200 angstroms thick. The preferred capacitor dielectric layer 48 is composed of materials having a high dielectric constant such as $Ta_2O_5$ or $BaTiO_3$.

Still referring to FIG. 7, a titanium nitride (TiN) metal layer 50 is formed on the capacitor dielectric layer 48 to complete the crown shaped stacked capacitor.

Although the formation of the bit line contact and the bit line metallurgy are not presented in previous description, it should be well understood by one skilled in the art to include additional process steps to form the bit line contact and the bit line either prior to or after the capacitor is fabricated. As is commonly reported in the literature and practice in the industry.

By way of the detail descriptions in this embodiment, a crown full metal capacitor electrode (metal/insulator/metal) with integrated selective tungsten contact hole is proposed. Having the high aspect ratio node contact (>10) nowadays, the present invention can fill the tungsten with void/seam free. Secondly, high reliability of the DRAM cell is achieved by using the bottom electrode with conductive metal.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for fabricating a storage capacitor with metal electrodes, said method comprising the steps of:

depositing and etching a metal landing pad on a device area of a semiconductor substrate;

depositing a first dielectric layer on said metal landing pad and said semiconductor substrate;

forming a node contact in said first dielectric layer aligned with said metal landing pad;

depositing and etching a barrier metal layer in said node contact to form a barrier metal spacer;

depositing selective tungsten in said node contact and etch back;

depositing a second dielectric layer on said first dielectric layer and said node contact;

forming an opening in said second dielectric layer aligned over said node contact;

depositing a first metal layer on said opening and said second dielectric layer;

forming a photoresist layer on said first metal layer;

polishing portions of said photoresist layer and said first metal layer to form a crown shaped said first metal layer;

removing said photoresist layer and said second dielectric layer;

depositing a high dielectric film on said crown shaped first metal layer and said first dielectric layer; and depositing a second metal layer on said high dielectric film.

2. The method of claim 1, wherein said step of depositing a metal landing pad further comprises:

depositing a titanium/titanium nitride barrier layer;

depositing a tungsten layer;

depositing a titanium nitride anti-reflection coating layer.

3. The method of claim 1, wherein said metal landing pad is etched by reactive ion etching.

4. The method of claim 1, wherein said barrier metal layer is titanium nitride.

5. The method of claim 1, wherein said step of depositing said barrier metal layer use a chemical vapor deposition method.

6. The method of claim 1, wherein said step of etching said barrier metal layer use underlayer tungsten as an etch stop.

7. The method of claim 1, wherein said step of etching said barrier metal layer use a reactive ion etching method.

8. The method of claim 1, wherein said etch back of selective tungsten use a reactive ion etching method.

9. The method of claim 1, wherein said first metal layer is a TiN/W layer.

10. The method of claim 1, wherein said step of polishing portions of said photoresist layer and said first metal layer use a chemical mechanical polishing method.

11. The method of claim 1, wherein said high dielectric film is selected from the group consisting of $Ta_2O_5$ and $BaTiO_3$.

12. The method of claim 1, wherein said second metal layer is a TiN layer.

13. A method for fabricating a storage capacitor of a DRAM cell, said method comprising the steps of:

forming a transistor on a semiconductor substrate;

depositing and etching a metal landing pad on a source/drain area of said transistor;

depositing a first dielectric layer on said metal landing pad, said transistor and said semiconductor substrate;

forming a node contact in said first dielectric layer aligned with said metal landing pad;

depositing and etching a barrier metal layer in said node contact to form a barrier metal spacer;

depositing selective tungsten in said node contact and etch back;

depositing a second dielectric layer on said first dielectric layer and said node contact;

forming an opening in said second dielectric layer aligned over said node contact;

depositing a first metal layer on said opening and said second dielectric layer;

forming a photoresist layer on said first metal layer;

polishing portions of said photoresist layer and said first metal layer to form a crown shaped said first metal layer;

removing said photoresist layer and said second dielectric layer;

depositing a high dielectric film on said crown shaped first metal layer and said first dielectric layer; and depositing a second metal layer on said high dielectric film.

14. The method of claim 13, wherein said step of depositing a metal landing pad further comprises:

depositing a titanium/titanium nitride layer;

depositing a tungsten layer;

depositing a titanium nitride anti-reflection coating layer.

15. The method of claim 13, wherein said metal landing pad is etched by reactive ion etching.

16. The method of claim 13, wherein said step of depositing said barrier metal layer use a chemical vapor deposition method.

17. The method of claim 13, wherein said step of etching said barrier metal layer use underlayer tungsten as an etch stop.

18. The method of claim 13, wherein said step of etching said barrier metal layer use a reactive ion etching method.

19. The method of claim 13, wherein said first metal layer is a TiN/W layer.

20. The method of claim 13, wherein said second metal layer is a TiN layer.

* * * * *